United States Patent [19]
Bell et al.

[11] 4,126,150
[45] Nov. 21, 1978

[54] PHOTOVOLTAIC DEVICE HAVING INCREASED ABSORPTION EFFICIENCY

[75] Inventors: Alan E. Bell, East Windsor; Brown F. Williams, Princeton, both of N.J.; David E. Carlson, Yardley, Pa.

[73] Assignee: RCA Corporation, New York, N.Y.

[21] Appl. No.: 848,250

[22] Filed: Nov. 3, 1977

Related U.S. Application Data

[63] Continuation-in-part of Ser. No. 782,190, Mar. 28, 1977, abandoned.

[51] Int. Cl.² .............................................. H01L 31/06
[52] U.S. Cl. ............................ 136/89 TF; 136/89 SJ; 136/89 CC; 357/30; 29/572; 427/74
[58] Field of Search .......... 136/89 CC, 89 SJ, 89 SG, 136/89 TF; 357/30; 29/572; 427/74

[56] References Cited
U.S. PATENT DOCUMENTS
4,064,521  12/1977  Carlson ..................................... 357/2

OTHER PUBLICATIONS
W. A. Anderson et al., "Schottky Solar Cells On Thin Epitaxial Silicon," Solid-State Electronics, vol. 19, pp. 973-974 (1976).
V. K. Jain et al., "A New Thin Solar Cell with Totally Reflecting Back Mirror," Phys. Stat. Sol. A., vol. 30, pp. K69-K72 (1975).

*Primary Examiner*—John H. Mack
*Assistant Examiner*—Aaron Weisstuch
*Attorney, Agent, or Firm*—H. Christoffersen; Birgit E. Morris; A. Stephen Zavell

[57] ABSTRACT

A photovoltaic device has a body which includes a thin film active region and a layer substantially transparent to solar radiation. The thickness of the transparent layer is such that a first antireflection condition is present for solar radiation at a wavelength which is relatively highly absorbed by the material of the active region. Furthermore, the combined thickness of the transparent layer and active region are such that a second antireflection condition is present for solar radiation at a wavelength which is poorly absorbed by the material of the active region. As a result of the prevailing antireflection conditions the solar radiation absorption efficiency of the photovoltaic device is increased.

17 Claims, 4 Drawing Figures and thickness. The reflectivity, R, of the film of refractive index, n, and thickness d, on a substrate (the active region 12) with a refractive index, n$_s$, is expressed as: (Here n$_0$ is the refractive index of air which is equal to one.)

PHOTOVOLTAIC DEVICE HAVING INCREASED ABSORPTION EFFICIENCY

BACKGROUND OF THE INVENTION

This application is a continuation-in-part of application Ser. No. 782,190, filed Mar. 28, 1977, now abandoned.

The present invention relates to providing improved antireflection conditions for photovoltaic devices and, more particularly, to fine tuning the antireflection capabilities of photovoltaic devices having a thin film active region.

In a photovoltaic device, such as a solar cell, the overall efficiency for power generation depends directly on the effectiveness with which the light radiation is coupled into and absorbed by the active region of the cell. The active region of a photovoltaic device is the portion wherein light radiation, i.e., solar radiation, is absorbed, thereby generating electrical carriers. The power generation of the solar cell is the result of the collection of these photogenerated carriers by a semiconductor junction in or at the active region.

In the case of single crystalline silicon solar cells, the diffusion length of the electrical carriers is relatively long, i.e., up to 100 microns. Thus any electronhole carrier pairs generated within about 100 microns of the semiconductor junction can contribute to the power generated by the cell. In this case, all that is required to effectively couple the light into the cell is a broadband antireflection layer on the cell's surface. An antireflection layer is typically a film of a dielectric material applied to a surface to reduce light reflection and thereby increase light transmission into the cell.

Typically, in the case of many photovoltaic devices having a thin film active region, i.e., of a few microns or less in thickness, the diffusion length of the photogenerated carriers is greatly reduced as compared to the carrier diffusion length of photovoltaic devices having thicker active regions of good crystalline materials, such as single crystal silicon. The reduction in diffusion length is caused by the thin film material having low carrier mobilities, such as, being polycrystalline or amorphous. Photovoltaic devices may have a thin film active region of a material such as amorphous silicon fabricated by a glow discharge in silane. Typically, the hole diffusion length in amorphous silicon fabricated by a glow discharge in silane is only about 3,000 angstroms (Å), as compared to a hole diffusion length of 100 micrometers for single crystalline silicon. However, photovoltaic devices having thin film active regions as described have typically been cheaper to fabricate than devices having thicker active regions of higher crystalline quality, and therefore provide an economic advantage.

The air mass one (AM1) solar spectrum contains a significant fraction of its energy in photons having wavelengths exceeding 6,000Å, referred to as the high wavelength portion of the solar spectrum. Solar radiation at wavelengths greater than 6,000Å demonstrate optical absorption lengths in many of the materials used for thin film active regions, including amorphous silicon fabricated by a glow discharge in silane, which exceeds the diffusion length of carriers generated in these materials. This means that if a thin film active region solar cell is fabricated using the same design principles established for thicker active region solar cells, the efficiency of the cell having the thin film active region will be diminished because little of the higher wavelength portion of the solar spectrum can be absorbed within the thin film active region. Thus, it would be most desirable to design photovoltaic devices having thin film active regions which have increased absorption of the higher wavelength portion of the solar spectrum.

SUMMARY OF THE INVENTION

A photovoltaic device has a body with an active region and a transparent layer with an incident surface for the collection of solar radiation. The transparent layer has a thickness chosen so that the incident surface is now non-reflective to solar radiation at a first wavelength and the combined thickness of the transparent layer and the active region is chosen so that the incident surface is non-reflective to solar radiation at a second, higher, wavelength.

DETAILED DESCRIPTION OF THE INVENTION

Figure 1:
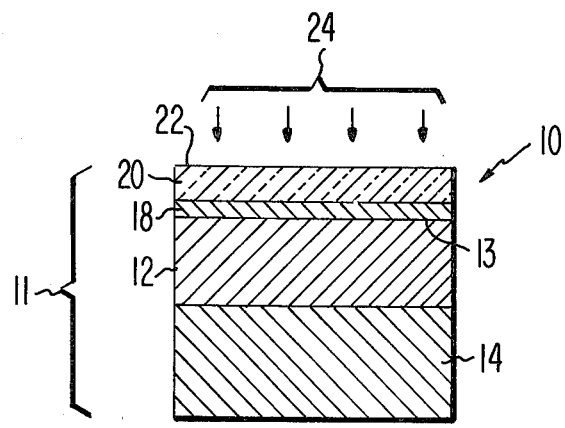
FIG. 1 is a first embodiment of the photovoltaic device of the present invention.

Referring to FIG. 1, the first embodiment of the photovoltaic device of the present invention is designated as 10. The photovoltaic device 10 is described as a Schottky barrier solar cell. However, it will be evident to those skilled in the art that the present invention could be a solar cell or photodetector, and can be of other semiconductor junction configurations, e.g., a PN junction structure, a PIN junction structure or a heterojunction structure.

The Schottky barrier solar cell 10 includes a body 11 having a thin film active region 12. The thin film active region 12 has a thickness in the range of 0.1 to 10 micrometers. By active region is meant that portion of the body 11 in which solar radiation can be absorbed to generate carriers. The active region 12 is of a thin film semiconductor material having good optical absorption properties. For the purpose of describing the present invention, the active region 12 is of amorphous silicon fabricated by a glow discharge in silane, as described in the copending application entitled "SEMICONDUCTOR DEVICE HAVING A BODY OF AMORPHOUS SILICON AND METHOD OF MAKING THE SAME" Ser. No. 710,183 filed on July 30, 1976 now U.S. Pat. No. 4,064,521. However, the active region 12 can be of other thin film semiconductor materials such as polycrystalline gallium arsenide or cadmium telluride.

A surface of the active region 12 is contiguous to a substrate 14. The substrate 14 is of a material which will reflect solar radiation impinging the substrate 14 and makes good electrical contact to the active region 12, such as aluminum. The substrate 14 functions as an electrical contact to the active region 12.

A metallic film 18 is contiguous to the active region 12 at a surface 13 of the active region 12 opposite the substrate 14. The metallic film 18 is a continuous film of a metal which is capable of forming a Schottky barrier, i.e., a surface barrier junction, with the amorphous silicon active region 12 at the surface 13. Typically, undoped amorphous silicon is slightly N type, thus the metallic film 18 should be of a high work function metal, i.e., of a work function of 4.5 eV or greater, in order to form a Schottky barrier. Suitable high work function metals are platinum, indium, rhodium and palladium. In addition, the metallic film 18 should be thin so that it is at least semitransparent to solar radiation, and should be of a relatively low sheet resistance. The transparency and low sheet resistance required of the metallic film 18, together with the fact that it is a continuous film, are factors which determine its thickness, as is known to those skilled in the art.

On the metallic film 18 opposite the active region 12 is a transparent layer 20 which has an incident surface 22 on which solar radiation 24 is capable of impinging the body 11. The transparent layer 20 is of a material substantially transparent to solar radiation such as dielectric materials including titanium dioxide, zirconium oxide or silicon nitride.

The active region 12 of amorphous silicon fabricated by a glow discharge in silane has an absorption profile over the solar spectrum such that solar radiation in the range of approximately 3,500Å to about 5,000Å is highly absorbed by the active region 12 (hereinafter referred to as the highly absorbing region). However, absorption by the amorphous silicon active region 12 decreases for solar radiation greater than 5,000Å in wavelength (hereinafter referred to as the poorly absorbing region).

One function of the transparent layer 20 is to ensure that solar radiation in the highly absorbing region of the amorphous silicon absorption profile is allowed to impinge the incident surface 22 substantially unreflected. Thus, the thickness of the transparent layer 20 should be such that the incident surface 22 is non-reflective to solar radiation at a first predetermined wavelength in the highly absorbing region. The first predetermined wavelength is chosen so that the maximum measure of solar radiation of the highly absorbing region is absorbed in the active region 12 as a result of this first antireflection condition being present. The thickness of the metallic film 18 to a small degree will influence the thickness of the transparent layer 20 in meeting the first antireflection condition.

Most beneficially in the present invention, the combined thickness of the transparent layer 20 and the active region 12 is tuned to a second predetermined wavelength in the poorly absorbing region, such that the absorption capabilities of the device 10 are increased for this poorly absorbing region. The second predetermined wavelength is chosen so as to maximize the measure of solar radiation of the poorly absorbing region being absorbed in the active region 12. This increased absorption is a result of this second antireflection condition being present at the incident surface 22 for solar radiation in the poorly absorbing region.

With an active region 12 of amorphous silicon fabricated by a glow discharge in silane, it has been found that preferably the transparent layer has a thickness such that it is an antireflection layer to solar radiation at about 5,000Å wavelength (the first predetermined wavelength) while the combined thickness of the active region 12 and transparent layer 20 is such that their combined thickness cause them to function as an antireflection layer to solar radiation at about 6,500Å wavelength (the second predetermined wavelength). The second predetermined wavelength will be higher than the first predetermined wavelength.

Figure 2:
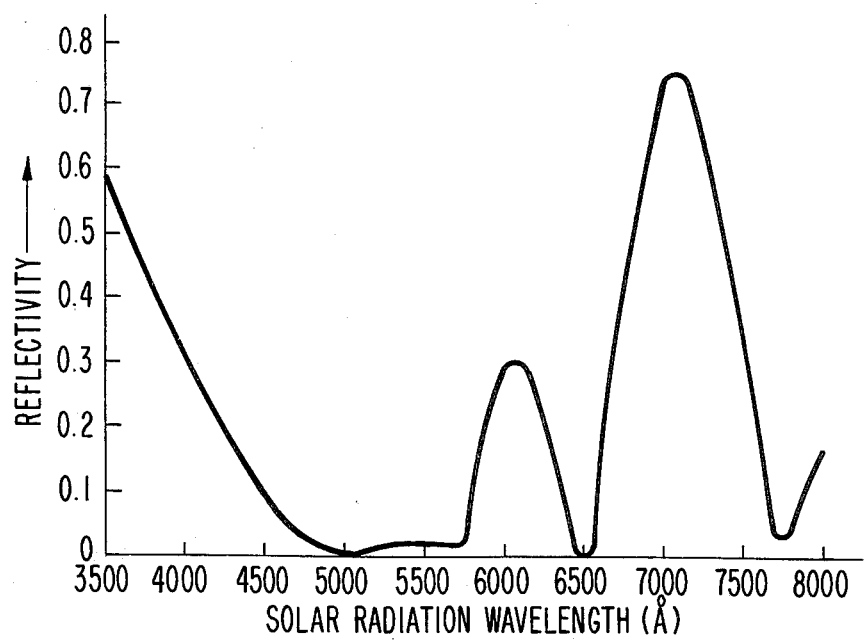
FIG. 2 is a graph of reflectivity versus solar radiation wavelength for the photovoltaic device of the present invention having a first predetermined wavelength at about 5,000Å and a second predetermined wavelength at about 6,500Å.

As is well known to those skilled in the art, in designing any antireflection layer or antireflection condition, a specific wavelength of radiation is chosen and the antireflection condition operates such that the lowest reflection at the incident surface occurs at this chosen wavelength. Solar radiation having a wavelength in the vicinity of the chosen wavelength (slightly longer or shorter in wavelength) will also have relatively low reflectivity at the incident surface. However, the farther the wavelength of radiation from the chosen wavelength, the higher its reflectivity at the incident surface. Referring to FIG. 2, for a first and second predetermined wavelength of 5,000Å and 6,500Å, the reflectivity at the incident surface 22 is relatively low for solar radiation on the wavelength range from 4,250Å to 6,750Å.

In the operation of the solar cell 10, solar radiation in the vicinity of the second predetermined wavelength which is not absorbed in a first pass through the active region 12 may be reflected back into the active region 12 by reflecting substrate 14 and may be absorbed during this second pass through the active region 12. However, even if the solar radiation in the vicinity of the second wavelength is not absorbed in a second pass through the active region 12, because the incident surface 22 is non-reflecting to solar radiation in the vicinity of the second predetermined wavelength, this solar radiation cannot exit the device 10 at the incident surface 22. Thus, this solar radiation which is poorly absorbed by the active region 12 is in essence trapped within the transparent layer 20 and active region 12, thereby improving its probability of eventually being absorbed within the active region 12. This trapping of solar radiation typically does not occur for the more highly absorbed radiation of the first predetermined wavelength, since this radiation is typically absorbed in its first pass through active region 12.

Figure 3:
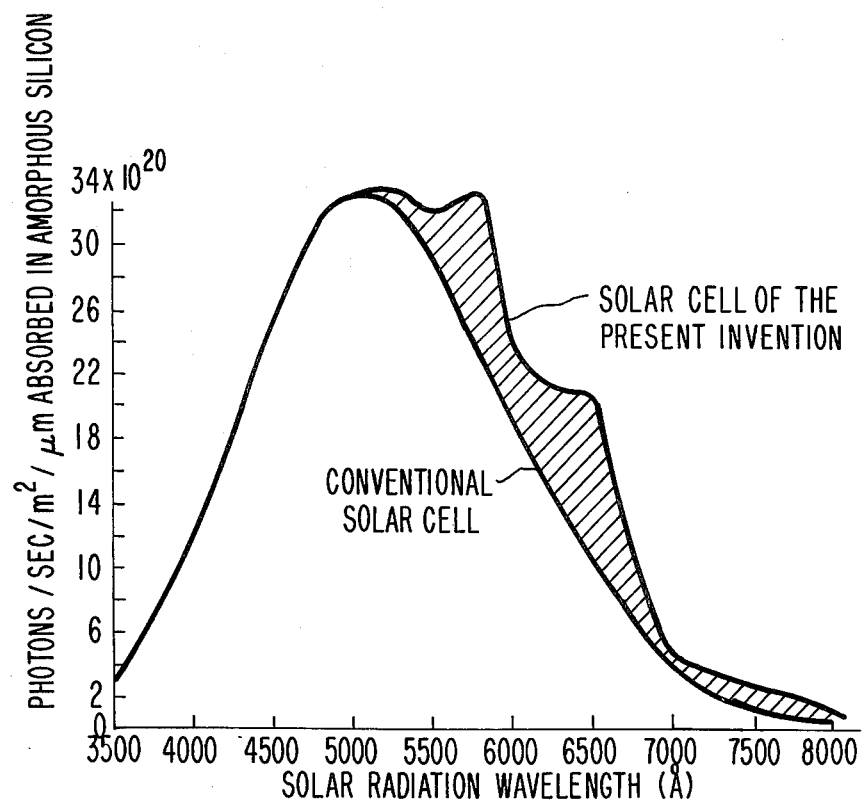
FIG. 3 is a graph comparing the solar radiation efficiency of the photovoltaic device of the present invention to a conventional amorphous silicon solar cell.

Referring to FIG. 3, a comparison is shown of the solar radiation absorption efficiency of a conventional solar cell having an active region of amorphous silicon fabricated by a glow discharge in silane, as compared to the solar cell 10 of the present invention. The solid line in FIG. 3 represents the solar radiation absorption curve for the conventional amorphous silicon solar cell and the dashed line coinciding with a portion of the solid line, represents the solar radiation absorption curve of the solar cell 10. Specifically, the conventional solar cell chosen for the purpose of comparison has an active region of amorphous silicon fabricated by a glow discharge in silane of approximately 10 micrometers in thickness. The active region is contiguous to a substrate of a material such as aluminum. On a substrate of the active region opposite the back contact is a metallic film of platinum, forming a Schottky barrier thereto. The metallic film is approximately 75Å in thickness. Contiguous to the metallic film opposite the active region is an antireflection layer of titanium dioxide ($TiO_2$) of approximately 340Å in thickness, so as to produce an antireflection condition for solar radiation at wavelengths of approximately 5,000Å.

Referring now to the solar cell 10 of the present invention, the transparent layer 20 and metallic film 18 are of the same materials and thicknesses as previously described for the conventional solar cell, thereby retaining the 5,000Å antireflection condition. However, the active region 12 is of approximately 3250Å in thickness and is on a reflective substrate 14 of aluminum. This particular thickness of the active region 12 was chosen so that the combined thickness of the transparent layer 20 and the active region 12 cause a second antireflection condition for solar radiation at approximately 6,500Å wavelength. Referring again to FIG. 3, the resultant increase in the absorption of the solar photon flux is clearly seen and is represented by the hatched area under the dashed curve representing the solar cell 10 of the present invention. The solar photon efficiency of the conventional amorphous silicon solar cell is approximately 28%, while that of the solar cell 10 of the present invention is approximately 33%, a gain of 18% over the original efficiency of the conventional solar cell.

In the fabrication of the solar cell 10, the substrate 14, assumed to be of aluminum, is placed in a conventional glow discharge apparatus. A glow discharge is initiated in a substantially silane atmosphere for the deposition of the active region 12 of amorphous silicon, onto the substrate 14. The substrate 14 and active region 12 are then placed in a conventional evaporation apparatus and the metallic film 18 is deposited on the active region 12 and the transparent layer 20 is then deposited on the metallic film 18.

Figure 4:
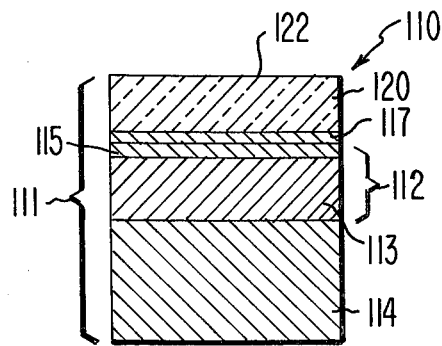
FIG. 4 is a second embodiment of the photovoltaic device of the present invention.

Referring to FIG. 4, a second embodiment of the photovoltaic device of the present invention is designated as 110. As in the explanation of the first embodiment, it is assumed that the second embodiment of the present invention is a Schottky barrier solar cell. The solar cell 110 includes a body 111 having therein a thin film active region 112 of a thin film semiconductor material having good optical absorption properties. Again, for the purpose of describing the present invention, the active region 112 is of amorphous silicon fabricated by a glow discharge in silane. Unlike the first embodiment, the active region includes a first layer 113 typically of amorphous silicon fabricated by a glow discharge in silane, i.e., undoped, and a second layer 115 of doped amorphous silicon fabricated by a glow discharge in a mixture of silane and a doping gas contiguous to the first layer 113. The second layer 115 is preferably heavily doped, e.g. contains 0.1 atomic percent of phosphorous. If the first layer 113 is about 3,000Å in thickness, the second layer 115 would typically be about 200Å in thickness. The active region 112 and specifically the first layer 113, is on a surface of a substrate 114. Like the substrate 14 of the first embodiment, the substrate 114 is of a material which is reflective to solar radiation. However, the substrate 114 is also of a material which is capable of forming a Schottky barrier, i.e., a surface barrier junction, with the active region 112. Materials suitable for the substrate 114 are metals such as rhodium, iridium, or platinum.

On a surface of the second layer 115 opposite the substrate 114 is a metallic layer 117 of a material capable of making good electrical contact, and preferably ohmic contact, to the second layer 115. Platinum is an example of such a material. The metallic layer 117 is also substantially transparent to solar radiation and is usually of a relatively thin thickness, e.g., about 50Å. On a surface of the metallic layer 117 is a solar radiation transparent layer 120 having an incident surface 122. Like the transparent layer 20 of the first embodiment, the transparent layer 120 is substantially transparent to solar radiation, but is also capable of making a good electrical contact to the metallic layer 117. A material capable of meeting the requirements of the transparent layer 120 is for example indium tin oxide.

The purpose of the metallic layer 117 is to assure the formation of an electrical contact and not a rectifying junction, between the transparent layer 120 and the active region 112. Furthermore, having a heavily doped layer, like second layer 115, contiguous to the metallic layer 117, provides a good electrical contact between the metallic layer 117 and active region 112. Since the undoped amorphous silicon of first layer 113 is slightly N type, the second layer 115 should be of the same conductivity type but of a higher concentration. For example, the second layer 115 can be doped with an N-type dopant such as phosphorous.

Like the first embodiment of the present invention, the transparent layer 120 of the solar cell 110 is of a thickness so as to establish a first antireflection condition at the incident surface 122, i.e., for a first predetermined wavelength, and the combined thickness of the transparent layer 120 and active region 112 are such that a second antireflection condition, i.e., for a second predetermined wavelength, is also present at the incident surface 122. As in the first embodiment, the thickness of the metallic layer 117 to a small degree will influence the thickness of the transparent layer 120 in meeting the first antireflection condition. While the second embodiment has been described as having a metallic layer 117 to prevent electrical rectification between the transparent layer 120 and active region 112, it is further anticipated that rectification could also be prevented by the doped second layer 115 alone, i.e., without the metallic layer 117.

The first and second embodiments of the present invention differ as to the location of the Schottky barrier junction in the body.

The operation of the second embodiment is in essence the same as that of the first embodiment.

With the active region 112 of amorphous silicon fabricated by a glow discharge in silane and the substrate 114 of platinum, the metallic layer 117 is about 50Å in thickness, the transparent layer 120 of indium tin oxide is approximately 525Å in thickness, so that a first antireflection condition is established at about 5,000Å wavelength. Furthermore, the thickness of the active region 112 is of about 3,200Å so that the combined thickness of the active region 112 and transparent layer 120 thereby provide a second antireflection condition at the incident surface 122 for solar radiation at about 6,500Å wavelength.

In the fabrication of the solar cell 110, the substrate 114, assumed to be platinum, is placed in a conventional glow discharge apparatus. A glow discharge is initiated in a substantially silane atmosphere for the deposition of the first layer 113. After deposition of the first layer 113, a dopant gas, such as phosphine, is bled into the glow discharge atmosphere for deposition of the second layer 115. The substrate 114 and active region 112 are then placed in a conventional evaporation apparatus for the deposition of the metallic layer 117 and transparent layer 120.

In the first embodiment of the present invention, means for making electrical contact to the active region 12 are the substrate 14 and metallic film 18. In the second embodiment of the present invention, means for making electrical contact to the active region 112 are the substrate 114 and the transparent layer 120 in series with the metallic layer 117.

It is anticipated by the present invention that the surface of the substrate in contact with the active region of both the first and second embodiments of the present invention may be roughened or angled so as to increase the capability of the incident surface in trapping unabsorbed solar radiation.

The photovoltaic devices of the present invention provide antireflection design criterias which bring about a device having increased gain in solar photon efficiency.

We claim:

1. An amorphous silicon photovoltaic device comprising:
    a solar radiation transparent layer having an incident surface on which solar radiation is capable of impinging, and wherein said transparent layer has a thickness such that said incident surface is substantially non-reflecting to incident solar radiation at a predetermined first wavelength in the solar radiation spectrum; and
    an active region comprising amorphous silicon below said transparent layer, said active region and said transparent layer having a combined thickness such that said incident surface is substantially non-reflecting to incident solar radiation at a predetermined second wavelength in the solar radiation spectrum, said second wavelength radiation having a higher wavelength than said first wavelength radiation.

2. The photovoltaic device in accordance with claim 1 wherein a metallic layer is between and adjacent said transparent layer and said active region, said metallic layer being of a material capable of forming a surface barrier junction with said active region.

3. The photovoltaic device in accordance with claim 2 comprising a substrate contiguous to said active region on a side opposite said transparent layer, said substrate being reflective to solar radiation traversing said active region, and forming an electrical contact with said active region.

4. The photovoltaic device in accordance with claim 3 wherein said active region is of amorphous silicon fabricated by a glow discharge in silane, said first predetermined wavelength is about 5,000Å and said second predetermined wavelength is about 6,500Å.

5. The photovoltaic device in accordance with claim 4 wherein said active region is about 3,250Å in thickness, said transparent layer is of titanium oxide and is about 340Å in thickness, and said metallic layer is of platinum about 75Å in thickness.

6. The photovoltaic device in accordance with claim 1 wherein said active region comprises a first, lower layer and a second upper layer incident to solar radiation, said first and second layers of the same conductivity type with said second layer of a higher conductivity concentration.

7. The photovoltaic device in accordance with claim 6 further comprising a metallic layer between and adjacent said transparent layer and said second layer, said metallic layer being of a meterial capable of having good electrical contact with said transparent layer and said second layer.

8. The photovoltaic device in accordance with claim 7 comprising a substrate contiguous to said first layer of said active region opposite said transparent layer, said substrate being of a material capable of forming a surface barrier junction with said active region, and said substrate being reflective to solar radiation traversing said active region.

9. The photovoltaic device in accordance with claim 8 wherein said first layer of the active region is of amorphous silicon fabricated by a glow discharge in silane and said second layer of the active region is of a doped amorphous silicon fabricated by a glow discharge in a mixture of silane and a doping gas, and said first predetermined wavelength is about 5,000Å and said second predetermined wavelength is about 6,500Å.

10. The photovoltaic device in accordance with claim 9 wherein said active region is about 3,200Å in thickness, and said transparent layer is of indium tin oxide about 525Å in thickness.

11. The photovoltaic device in accordance with claim 1 wherein said active region is a thin film of a thickness in the range of 0.1 to 10 micrometers.

12. A method of increasing the photon absorption efficiency of an amorphous silicon solar cell comprising:
    depositing an active region of amorphous silicon on a substrate forming an electrical contact thereto and a transparent antireflection layer substantially non-reflecting to solar radiation at a first predetermined wavelength on said active region such that the combined thickness of said transparent layer and said active region is substantially nonreflecting to solar radiation at a predetermined second wavelength in the solar spectrum, said second wavelength radiation having a higher wavelength than said first wavelength radiation.

13. The method according to claim 12 wherein said substrate is reflective to solar radiation traversing said active region.

14. The method according to claim 13 wherein said active region is amorphous silicon fabricated by a glow discharge in silane, said first predetermined wavelength is about 5,000 angstroms and said second predetermined wavelength is about 6,500 angstroms.

15. The method according to claim 14 wherein said active region is about 3,200 angstroms in thickness and said transparent layer is of indium tin oxide about 525 angstroms in thickness.

16. A method according to claim 14 further comprising:
    depositing a metallic layer between said active region and said transparent layer, said metallic layer capable of forming a surface barrier junction with said active region.

17. The method according to claim 16 wherein said active region is about 3,250 angstroms in thickness, said transparent layer is of titanium oxide about 340 angstroms in thickness, and said metallic layer is of platinum about 75 angstroms in thickness.

* * * * *